United States Patent Office

3,698,931

Patented Oct. 17, 1972

3,698,931
METHOD OF GRAFTING POLYMERIZABLE MONOMERS ONTO SUBSTRATES

Carl Horowitz, Brooklyn, N.Y., assignor to Polymer Research Corp. of America, Brooklyn, N.Y.

No Drawing. Filed June 18, 1969, Ser. No. 834,489
Int. Cl. B44d *1/12;* C03c *17/00;* C08f *1/34, 29/50;* D06d *1/00*
U.S. Cl. 117—47 R 2 Claims

ABSTRACT OF THE DISCLOSURE

A substrate is contacted with a grafting solution containing a silver salt, a polymerizable monomer and a catalyst which is adapted to activate the monomer to polymerization by itself being activated by metallic silver. The silver ion is reduced by the substrate and forms an insoluble metallic silver deposit on the substrate. The metallic silver activates the catalyst which in turn activates the polymerization reaction so that polymerization takes place and the formed polymer is grafted onto the substrate.

BACKGROUND OF THE INVENTION

The present invention relates to the intimate bonding of polymeric materials to various objects (in general hereinafter being referred to as "substrates") and to the method of accomplishing the same.

Methods have been provided for the bonding of polymeric materials to substrates by depositing silver onto the substrates, for example, by means of sodium hydroxide which reduces the silver, and then contacting the substrate having the deposited silver with a polymerizable composition, including a catalyst which is activated by the deposited silver. While this method produced highly satisfactory bonding of the polymerized material to the substrate, several steps and several reaction mediums were required in order to carry out the method.

The previous methods of grafting a polymerizable monomer onto a substrate was not based on the reduction of the silver being carried out by the substrate. As a consequence, the substrate was not oxidized and no radicals were formed on the substrate.

It is accordingly a primary object of the present invention to provide for grafting of polymerized material to substrates in a single stage operation utilizing a single reaction medium.

It is a further object of the present invention to provide a simplified method of almost simultaneously depositing silver onto a substrate and reacting a polymerizable monomer-catalyst composition which is activated by the silver with the silver so that the polymer is formed at the site of the deposited silver and is thus grafted onto the substrate.

It is another object of the present invention to provide for the grafting of polymerized material onto substrates wherein the substrate itself is oxidized so that attachment occurs directly on the substrate.

Other objects and advantages of the present invention will be apparent from the further reading of the specification and of the appended claims.

With the above and other objects in view, the present invention mainly comprises contacting a non-metallic body with a solution containing a silver salt, and a polymerizable composition including a catalyst which is adapted to be activated to polymerization by silver oxide or colloidal silver, whereby the non-metallic object causes reduction of the silver salt to colloidal silver or silver oxide which is formed at and dipsersed and bonded to the object, and thereupon activates the catalyst to cause polymerization, whereby the resulting polymer is bonded directly to the non-metallic object at the sites of deposition of the silver to form an intimate bonding of the polymer onto the object.

It will be seen that this method is highly advantageous in that the silver is incorporated into the grafting solution so that the entire grafting process can be carried out in a single step.

In accordance with the method of the present invention, as will be explained in reaction equations which are set forth below, the silver ions are reduced by the substrate with radicals being formed as a result on the substrate. The polymerizable monomer attaches itself to these radical sites, thus forming an intimate covalent bond with the substrate. This bonding is extremely strong.

The overall reaction is believed to proceed in accordance with the following equations, in which a vinyl monomer is taken for exemplatory purposes:

(1) $$Ag^{+} + RH \rightarrow R\cdot + Ag^{\circ} + H^{+}$$

R—Substrate
R:—Substrate with a radical
Ag°—Silver metal (2)(a) $$R\cdot + CH_2{=}\underset{X}{\underset{|}{CH}} \rightarrow RCH_2{-}\underset{C}{\underset{|}{\dot{C}H}}$$

(b) $$RCH_2{-}\underset{X}{\underset{|}{\dot{C}H}} + CH_2{=}\underset{X}{\underset{|}{CH}} \rightarrow RCH_2{-}\underset{X}{\underset{|}{CH}}{-}CH_2{-}\underset{X}{\underset{|}{\dot{C}H}}$$

etc. X—Pendant groups.

(3) $$Ag^{\circ} + HOOH - Ag^{+} + OH^{-} + OH\cdot$$

Reaction 1 gives a radical site on the substrate by reducing silver to metal and oxidizing the substrate. Silver is a powerful oxidizing agent (it reduces readily) and forms an insoluble metallic deposit on the substrate only. Silver is therefore substantive to the substrate.

In the reaction #2 the vinyl monomer molecule attaches itself at the radical site, forming the first graft. The second vinyl monomer molecule attaches itself to the first etc., thus forming a side chain.

In the reaction #3, the peroxide type catalyst reacts with silver metal, giving hydroxyl radicals and silver ions can now repeat the entire cycle from the beginning. Thus silver acts as a true catalyst for grafting, yet by itself it cannot polymerize the monomer on its own.

In addition the hydroxyl radicals produced directly on the substrate in the reaction #3, cause formation of interpolymer which is intimately intermingled with the molecules of the substrate and resist leaching out. Thus only graft polymer and interpolymer are formed but no homopolymer.

The following are among the non-metallic substrates grafted upon: cellophane, cotton fibers and fabrics, rayon fibers and fabrics, wood, nylon fibers, fabrics and films, polyester and polyester-cotton mixtures, such as those used in durable press, fiberglass fibers, fabrics and glass in any form, cellulose acetate and triacetate fibers and fabrics, polyethylene and polypropylene fibers, fabrics and films, natural and synthetic rubber sheets, and objects, leather, carbon bodies, wool, tire cord, solid plastic objects of all mentioned above, paper and paper products, minerals such as asbestos, kaolin, mica, atapulgite, polyurethane foams (rigid and flexible), pigments, etc.

The invention is applicable to the use of any polymerizable monomers, such as: vinylidene chloride, chloroprene, isoprene, dimethylaminoethyl methacrylate, styrene, 1.3-butylene dimethacrylate, isooctylvinyl ether, acrylonitrile, acrylamide, N-vinyl pyridine, glycidyl methacrylate, N-vinyl caprolactam, N-vinyl pyrrolidone, N-vinyl carbazole, acrylic acid, methacrylic acid, ethyl acrylate, ethyl methacrylate, itaconic acid, isobutylmethacrylate, methyl acrylate, sodium styrene sulfonate, sodium vinyl sulfonate, bis(beta-chloroethyl) vinyl phosphonate, cetyl vinyl ether, divinylether of ethylene glycol, divinyl ether of butanediol, vinyl toluene, vinyl acetate, octadecyl vinylether. Also mixtures of 2 or more monomers can be used. The monomeric tertiary amines can be quaternized with benzyl chloride, ethyl iodide, methyl or ethylsulfate. Conversely, monomeric chlorides can be quaternized with tertiary amines to give quaternary ammonium compounds. Some suitable tertiary amines are: N-ethyl morpholine, pyridine, cetyldimethyl pyridine, dimethyl aniline, etc.

The monomers can be copolymerized with cross-linking agents such as butadiene, divinylbenzene or maleic anhydride.

Additional monomers are:

Mono, di-, tri-, tetra- and poly-ethylene glycoldimethacrylate, methylvinylpyridine, allylacrylate and methacrylate, allylchloride, allylalcohol, perfluoro alkyl acrylates and methacrylates, p-amino-styrene, vinyl bromide and vinylidene bromide, trimethylvinylbenzylammonium chloride, vinyltrifluoroacetate (followed by hydrolysis to poly-vinyl alcohol), diallyl chloromethyl phosphonate, diallyl benzene phosphonate, diallyl dimethyl ammonium chloride, diallyl diethyl ammonium bromide, glycidyl acrylate and methacrylate, ethylene glycol, diethyleneglycol- and polyethylene glycol acrylates and methacrylates, vinyl perfluoro octanoate, etc.

The monomer can be dissolved in a suitable solvent such as dimethylformamide, tetrahydrofurane, tetrahydrofurfuryl alcohol, dimethylsulfoxide, water, methyl, ethyl or isopropyl alcohol, acetone, methyl ethyl ketone and ethyl acetate. Also mixtures of two or more of the above can be used.

Among the catalysts which can be used are: ammonium persulfate, hydrogen peroxide, tert-butylhydroperoxide, ditert-butyl peroxide, benzoyl peroxide, dicumyl peroxide, lauroyl peroxide, tert-butyl perbenzoate and peracetic acid.

Depending on the monomer used, such diversified properties can be imparted to the substrate as: permanent nonflammability, flame-retardancy, soil repellancy, soil release, resistance to soil redeposition, water absorbency or conversely water repellancy, oil repellancy, increased dyeability, dye leveling, color wash wastness, dry cleanability, permanent softness, increased wrinkle recovery, abrasion resistance, increased tensile, tear and burst strength, antistatic properties. Very specific effects can be obtained such as increased water flow in membranes for reverse osmosis, reduced skin irritation in fiberglass fabrics, increased adhesion of various materials such as tire cord to rubber tires or fabric laminates.

The concentration of the silver nitrate can vary within a wide range through it is preferably between .01% to .0001%. The value of about .001% or lower is preferable for reasons of economy. There is also no discoloration due to silver at these values.

The concentration of the monomer in the solution can likewise vary within practically any limits, for example between about 0.1% and 50%, though the preferred concentration is between 1–20% by weight.

Any silver salt can be used, including: silver nitrate, silver acetate, silver sulfate, silver carbonate. If a nonaqueous system is used then silver perchlorate is recommended since it is soluble in organic solvents.

DESCRIPTION OF PREFERRED EMBODIMENTS

The following examples are given to further illustrate the present invention. The scope of the invention is not, however, meant to be limited to the specific details of the examples.

EXAMPLE 1

A solution is prepared consisting of:

.001 g. silver nitrate
1000 cc. water
10 g. hydroxyethylmethacrylate
2.5 g. ethylhexylacrylate
2 g. maleic anhydride
1 g. t-butylhydroperoxide
1 g. tergitol anionic #4 which is the trade name for sodium tetradecyl sulfate A sample of flame cleaned fiberglass fabric is immersed in the above solution, the excess squeezed out and the fabric cured at 350° F. for 2 min. A grafted fiberglass fabric with soft, pleasant hand is obtained with increased abrasion resistance (Taber value: 150 RPM as compared to 70 for untreated control).

The add-on on the fabric is 2% by weight and it cannot be removed by numerous washings with detergents and leaching with solvents. The glass fabric is not irritating to the skin and has high slippage resistance. It has a dull, white appearance.

EXAMPLE 2

A solution is prepared consisting of:

60 g. hydroxyethylmethacrylate
40 g. 2-ethylhexylacrylate
100 g. isopropyl alcohol
220 cc. water
2 g. potassium persulfate
1 cc. of 35% hydrogen peroxide
.001 g. silver perchlorate Rubber catheters such as used for insertion in the human body, are placed in the above solution for 1½ hrs. at 70° C., 420 g. acetone added, the catheters taken out and cured for 3 hrs. at 175 to 200° F.

A permanently water-absorbent layer of graft polymer is formed on the surface of rubber which is wetted by isotonic solution and biological fluids such as blood and plasma.

EXAMPLE 3

A piece of glass (microscope slide) is placed in a solution containing:

5 g. perfluorononylacrylate
50 cc. water
50 g. isopropyl alcohol
.2 g. ammonium persulfate
.001 g. silver nitrate The solution is maintained for 2 hrs. on a water bath during which time a layer of polymer is formed on the glass slide and glass container walls. This layer cannot be removed with solvents or boiling water and is oil and water repellant thus giving a permanent fluorine polymer protection to glass against hydrolysis.

EXAMPLE 4

Loeb membrane for water desalting is prepared from cellulose acetate as described in U. Merten "Desalination by Reverse Osmosis," the M.I.T. Press, 1966. One-half of this membrane is then immersed in a solution consisting of:

125 cc. water
125 quaternization product of dimethylaminoethyl methacrylate and dimethylsulfate
125 g. ammonium persulfate
.3 g. sodium m-bisulfite
.001 g. silver nitrate The membrane is left overnight at room temperature and heated at 160° F. for 8 hrs.

When placed in reverse osmosis apparatus it gave a flow of 37.1 gallons per foot square per day at 95% salt rejection at 800 p.s.i. using a 0.1 N sodium chloride stock solution. An untreated Loeb membrane gave under identical conditions a flow of 7.2 gallons per foot square per day at 97.3% salt rejection.

EXAMPLE 5

A sample of scoured polyester/cotton fabric, 50/50 mixture such as used in durable press, was treated with the following solution:

250 g. isopropyl alcohol
250 cc. water
25 g. perfluorononylacrylate
4 g. ammonium persulfate
2 g. sodium m-bisulfite
2 g. maleic anhydride
.002 g. silver nitrate The fabric was placed in the above solution for ½ min., squeezed and cured for 3 min. at 325° F. When a drop of olive oil was placed on the fabric it beaded up and did not penetrate into the fabric and could be easily wiped off without any trace, whereas an untreated fabric absorbed the oil in 5 sec. This spot then could not be removed even with repeated launderings. Similarly a drop of water beaded up on the grafted fabric and was not absorbed whereas untreated control absorbed the water in 15 sec.

EXAMPLE 6

A piece of cotton is immersed in a solution containing:

20 g. vinylidene bromide
10 g. bis (bethachloroethyl) vinylphosphonate
100 g. isopropyl alcohol
100 cc. water
2 g. ammonium persulfate
1 g. sodium metabisulfite
2 g. maleic anhydride
.001 g. silver nitrate After 1 minute, the fabric is taken out, squeezed, cured for 3 minutes at 325° F. and dried. The fabric is completely non-flammable when tested by the AATCC 34 and AATCC 33 methods. Also after 10 launderings the fabric was non-flammable when tested as above.

While the invention has been illustrated in particular with respect to the grafting of certain polymers on certain substrates, it is apparent that variations and modifications of the invention can be made without departing from the spirit and scope thereof.

What is claimed is:

1. Mehod of grafting a polymer onto a non-metallic substrate oxidizable by silver ions, which comprises contacting said non-metallic substrate with a solution of a soluble silver salt selected from the group consisting of silver nitrate, silver acetate, silver sulphate, silver carbonate and silver perchlorate in an amount of about 0.01% to 0.0001% by weight, said solution thus containing silver ions, and also containing a polymerizable composition consisting essentially of a solution in a solvent selected from the group consisting of dimethylformamide, tetrahydrofurane, tetrahydrofurfuryl alcohol, dimethylsulfoxide, water, methyl alcohol, ethyl alcohol, isopropyl alcohol, acetone, methyl ethyl ketone, ethyl acetate and mixtures thereof of a per-catalyst selected from the group consisting of ammonium persulfate, hydrogen peroxide, tert-butylhydroperoxide, ditertbutyl peroxide, benzoyl peroxide, dicumyl peroxide, lauroyl peroxide, tert-butylperbenzoate and peracetic acid and a polymerizable monomer in an amount of 0.1–50% by weight which is activated to polymeriztaion by activation of said per-catalyst, said catalyst activated by metallic silver, whereby the silver ions of said silver salt are reduced by said non-metallic substance to metallic silver which precipitates onto said non-metallic substrate and there activates said catalyst while in turn being reconverted by said catalyst back to silver ions which can be reduced by additional non-metallic substrate to metallic silver which can activate additional catalyst, whereby polymerization occurs at the site of said metallic silver on said substrate and the resulting polymer is chemically bound directly to said non-metallic substrate, thereby forming an intimate bonding of the polymer onto said substrate.

2. Method according to claim 1 wherein said non-metallic substrate is selected from the group consisting of cellophane, cotton fibers and fabrics, rayon fibers and fabrics, wood, nylon fibers, fabrics and films, polyester and polyester-cotton fibers and fabrics, fiberglass fibers and fabrics, glass, cellulose acetate and triacetate fibers and fabrics, polyethylene and polypropylene fibers, fabrics and films, natural and synthetic rubber, leather, carbon, wool, paper, asbestos, kaolin, mica, atapulgite, polyurethane and pigments.

References Cited

UNITED STATES PATENTS

| | | | |
|---|---|---|---|
| 2,419,090 | 4/1947 | Rainard | 260—86.5 |
| 3,083,118 | 3/1963 | Bridgeford | 117—47 |
| 3,194,727 | 7/1965 | Adams et al. | 162—168 |
| 3,376,168 | 4/1968 | Horowitz | 136—146 |
| 3,401,049 | 9/1968 | Horowitz | 117—47 |

OTHER REFERENCES

Bridgeford: "Catalytic Deposition and Grafting of Olefin Polymers into Cellulosic Materials," Industrial and Engineering Chemistry Product Research and Development, vol. 1, pp. 45–51, 1962.

WILLIAM H. SHORT, Primary Examiner

E. WOODBERRY, Assistant Examiner

U.S. Cl. X.R.

8—85, 94.21, 100, 115.5, 115.7, 116, 116.2, 128, 128 A, 129, 168, DIG 4, DIG 9, DIG 18, DIG 21; 117—47 A, 118, 124 E, 138.5, 138.8 E, 126 GR, 155 UA; 162—9; 252—428, 476; 260—2.5 A, 3.5, 17 A, 17.4 R, 17.4 GC, 94.3, 857, 873